US011170971B2

(12) United States Patent
Pettibone (10) Patent No.: US 11,170,971 B2
(45) Date of Patent: Nov. 9, 2021

(54) MULTIPLE WORKING DISTANCE HEIGHT SENSOR USING MULTIPLE WAVELENGTHS (71) Applicant: KLA—Tencor Corporation, Milpitas, CA (US)

(72) Inventor: Donald Pettibone, San Jose, CA (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 16/511,197

(22) Filed: Jul. 15, 2019

(65) Prior Publication Data
US 2020/0035451 A1 Jan. 30, 2020

Related U.S. Application Data (60) Provisional application No. 62/702,821, filed on Jul. 24, 2018.

(51) Int. Cl.
H01J 37/28 (2006.01)
H01J 37/20 (2006.01)
(Continued)

(52) U.S. Cl.
CPC .......... *H01J 37/28* (2013.01); *G01N 15/0227* (2013.01); *H01J 37/20* (2013.01);
(Continued)

(58) Field of Classification Search
CPC .......... H01J 37/20; H01J 37/244; H01J 37/28; H01J 2237/2842; H01J 2237/20235; G01N 15/0227; G01N 2015/1075; G02B 21/0064
See application file for complete search history.

(56) References Cited

U.S. PATENT DOCUMENTS 5,166,529 A * 11/1992 Ando .................. B82Y 10/00
250/491.1
5,209,813 A * 5/1993 Oshida ................ B82Y 10/00
216/41
(Continued)

FOREIGN PATENT DOCUMENTS

JP 2002048740 A 2/2002
JP 2010071969 A 4/2010
(Continued)

OTHER PUBLICATIONS

International Search Report and Written Opinion dated Mar. 26, 2020 for PCT/US2019/042307.

*Primary Examiner* — David E Smith
(74) *Attorney, Agent, or Firm* — Suiter Swantz pc llo (57) ABSTRACT A system is disclosed. The system includes a stage assembly configured to receive a specimen and maintain a height of the specimen at a first working distance height during a first characterization mode and an additional working distance height during an additional characterization mode. The system further includes an illumination source configured to generate an illumination beam. The system further includes an illumination arm including a set of optical elements configured to direct a portion of the illumination beam including illumination of a first wavelength to the specimen during the first characterization mode, and direct a portion of the illumination beam including illumination of an additional wavelength to the specimen during the additional characterization mode. The system further includes a detector assembly configured to receive illumination emanated from the specimen, and a controller configured to determine a specimen height value based on the illumination received by the detector assembly.

20 Claims, 5 Drawing Sheets (51) Int. Cl.
  *H01J 37/244*   (2006.01)
  *G01N 15/02*    (2006.01)
  *G02B 21/00*    (2006.01)

(52) U.S. Cl.
  CPC ........ *H01J 37/244* (2013.01); *G02B 21/0064* (2013.01); *H01J 2237/2482* (2013.01)

(56) References Cited

U.S. PATENT DOCUMENTS

| | | | |
|---|---|---|---|
| 5,597,006 A | 1/1997 | Simonetti | |
| 7,499,185 B2 | 3/2009 | Nomaro et al. | |
| 9,916,965 B2 * | 3/2018 | Bhaskar | G01N 23/2251 |
| 10,641,607 B2 * | 5/2020 | Sekiguchi | H01J 37/21 |
| 2008/0302974 A1 * | 12/2008 | Wang | G06T 7/001 |
| | | | 250/442.11 |
| 2009/0123897 A1 * | 5/2009 | Shangle | G09B 19/0076 |
| | | | 434/263 |
| 2016/0025480 A1 * | 1/2016 | Goodwin | G01B 9/02097 |
| | | | 356/498 |
| 2019/0323835 A1 * | 10/2019 | Sekiguchi | H01J 37/21 |

FOREIGN PATENT DOCUMENTS

| | | | |
|---|---|---|---|
| KR | 101794641 B1 * | 11/2017 | |
| KR | 101794641 B1 | 11/2017 | |

\* cited by examiner

MULTIPLE WORKING DISTANCE HEIGHT SENSOR USING MULTIPLE WAVELENGTHS

CROSS-REFERENCE TO RELATED APPLICATION

The present application claims the benefit under 35 U.S.C. § 119(e) of U.S. Provisional Application Ser. No. 62/702,821, filed Jul. 24, 2018, entitled MULTIPLE WORKING DISTANCE HEIGHT SENSOR USING DISPERSION AND MULTIPLE WAVELENGTHS, naming Donald Pettibone as inventor, which is incorporated herein by reference in the entirety.

TECHNICAL FIELD

The present invention generally relates to specimen characterization, and, more particularly, to a system and method for multiple working distance heights during characterization processes.

BACKGROUND

Specimen characterization systems, such as optical and electron beam review and inspection systems, often include working distance systems configured to maintain the height of the specimen at a specified working distance relative to one or more components of the particular characterization system. In particular, electron beam systems which cover a wide range of electron beam operating parameters require that the system operate at multiple working distances from the electron beam objective. However, traditional working distance systems are not capable of maintaining a specimen at multiple working distances. Accordingly, in characterization processes which require the specimen to be maintained at multiple working distances at various steps of the process, traditional working distance systems are unable to generate feedback loops required to continuously and efficiently maintain the specimen at the multiple working distances. Therefore, it would be desirable to provide a system and method which cure one or more shortfalls of the previous approaches identified above.

SUMMARY

A system is disclosed, in accordance with one or more embodiments of the present disclosure. In one embodiment, the system includes a stage assembly configured to receive a specimen. In another embodiment, stage assembly may be configured to maintain a height of the specimen at a first working distance height during a first characterization mode and an additional working distance height during an additional characterization mode. The system may further include one or more illumination sources configured to generate an illumination beam. In another embodiment, the system includes an illumination arm including a first set of one or more optical elements configured to direct a portion of the illumination beam including illumination of a first wavelength to the specimen during the first characterization mode, and direct a portion of the illumination beam including illumination of an additional wavelength to the specimen during the additional characterization mode. The system may further include a detector assembly configured to receive illumination emanated from the specimen. In another embodiment, the system includes a controller communicatively coupled to the detector assembly, wherein the controller is configured to determine a specimen height value based on the illumination received by the detector assembly.

A specimen characterization system is disclosed, in accordance with one or more embodiments of the present disclosure. In one embodiment, the system includes a scanning electron microscopy sub-system configured to carry out one or more characterization processes on a specimen. In another embodiment, the system includes a stage assembly configured to receive the specimen, the stage assembly configured to maintain a height of the specimen at a first working distance height during a first characterization mode and an additional working distance height during an additional characterization mode. In another embodiment, the system includes one or more illumination sources configured to generate an illumination beam. In another embodiment, the system includes an illumination arm including a first set of one or more optical elements configured to direct a portion of the illumination beam to the specimen during the first characterization mode, and direct a portion of the illumination beam to the specimen during the additional characterization mode. In another embodiment, the system includes a detector assembly configured to receive illumination emanated from the specimen. In another embodiment, the system includes a controller communicatively coupled to the detector assembly, the controller configured to determine a specimen height value based on the illumination received by the detector assembly.

A method is disclosed, in accordance with one or more embodiments of the present disclosure. In one embodiment, the method includes: maintaining a specimen disposed on a stage assembly at a first working distance; directing illumination of a first wavelength to the specimen at the first working distance; detecting illumination emanating from the specimen at the first working distance with a detector assembly; determining a first deviation value from the first working distance based on the detected illumination; generating one or more control signals configured to adjust the height of the specimen to the first working distance to correct for the first determined deviation value; actuating the stage assembly to maintain the specimen at an additional working distance; directing illumination of an additional wavelength to the specimen at the additional working distance; detecting illumination emanating from the specimen at the additional working distance with the detector assembly; determining an additional deviation value from the additional working distance based on the detected illumination; and generating one or more control signals configured to adjust the height of the specimen to the additional working distance to correct for the additional determined deviation value.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Specimen characterization systems, such as optical and electron beam review and inspection systems, often include working distance systems configured to maintain the height of the specimen at a specified working distance relative to one or more components of the particular characterization system. However, traditional working distance systems are not capable of maintaining a specimen at multiple working distances if the working distance range exceeds the limited control range of traditional Z-height sensors (ZHS). Accordingly, in characterization processes which require the specimen to be maintained at multiple working distances, traditional working distance systems are unable to generate feedback loops required to continuously and efficiently maintain the specimen at the multiple working distances.

Accordingly, embodiments of the present disclosure are directed at curing one or more of the shortfalls of the previous approaches identified above. Embodiments of the present disclosure are directed to a Z-height sensor (ZHS) configured to maintain a specimen at multiple working distance heights. More particularly, embodiments of the present disclosure are directed to the use of optical dispersion in order to direct a plurality of wavelengths to a specimen maintained at a plurality of working distances.

Figure 1:
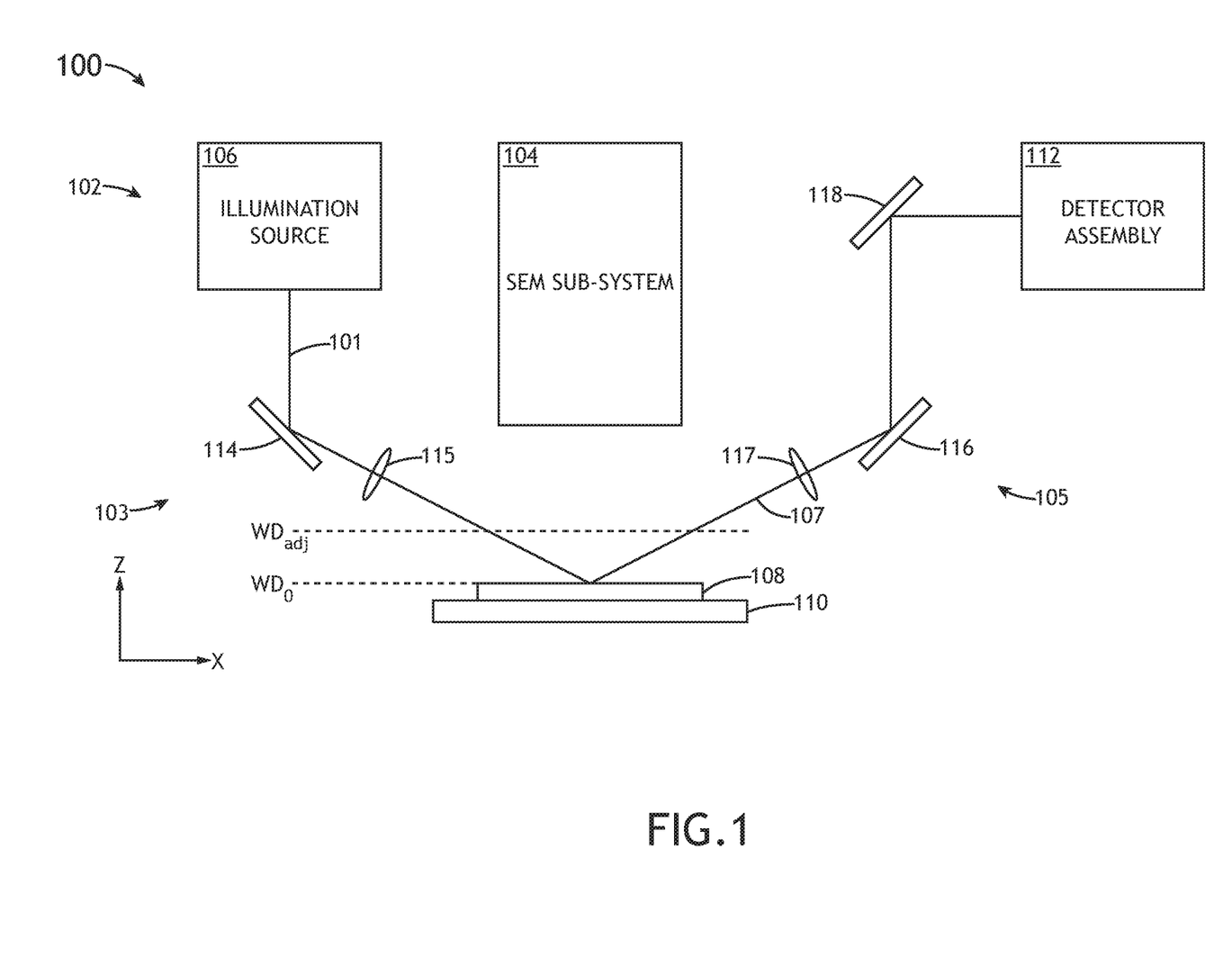
FIG. 1 illustrates a specimen characterization system with a single-height Z-height sensor (ZHS).

FIG. 1 illustrates a specimen characterization system 100 with a single-height Z-height sensor (ZHS) 102. The single-height ZHS 102 shown and described in FIG. 1 is representative of a traditional ZHS system configured to maintain a sample at a single working distance. In this regard, it is contemplated herein that a brief description of a traditional system may provide a baseline against which advantages of the present disclosure may be compared.

The characterization system 100 may include a single-height ZHS 102 and a characterization sub-system. The characterization sub-system may include any optical or charged particle system known in the art configured to carry out one or more characterization processes (e.g., inspection processes, review processes, and the like). For example, the system 100 may include a scanning electron microscopy (SEM) sub-system 104 configured to carry out one or more characterization processes/functions on a specimen 108.

The single-height ZHS 102 may include an illumination source 106, an illumination arm 103, a collection arm 105, and a detector assembly 112. The illumination source 106 is configured to generate an illumination beam 101 and direct the illumination beam 101 to the specimen 108 disposed on a stage assembly 110 via the illumination arm 103. The illumination arm 103 may include one or more optical elements configured to direct the illumination beam 101 to the specimen 108. For example, as shown in FIG. 1, the illumination arm 103 may include one or more mirrors 114 and one or more lenses 115. Similarly, the collection arm 105 of the single-height ZHS 102 may include one or more optical elements configured to collect illumination 107 emanating from the surface of the specimen 108 and direct the collected illumination 107 to the detector assembly 112. For example, as shown in FIG. 1, the collection arm 105 may include a first mirror 116, one or more lenses 117, and a second mirror 118.

The single-height ZHS 102 is configured to maintain the height of the specimen 108 at a particular working distance ($WD_0$) during the one or more characterization processes. More particularly, the traditional single-height ZHS 102 is configured to direct the illumination beam 101 to the specimen 108 maintained at the working distance ($WD_0$). The illumination arm 103 is then configured to direct the illumination beam 101 to the center of a field of view (FOV) of the characterization sub-system (e.g., SEM sub-system 104). The illumination beam 101 may then reflect, refract, or otherwise emanate from the specimen 108 as illumination 107.

The collection arm 105 is configured to collect the illumination 107 emanating from the specimen 108 and direct the illumination 107 to the detector assembly 112. The detector assembly 112 may then be configured to determine a height of the specimen 108 based on the relative positioning of a spot of the illumination 107 on the detector assembly 112. In this regard, changes in the working distance of the specimen 108 would result in changes of the spot position of the illumination 107 on the detector assembly 112. For example, slight changes in the working distance of the specimen 108 would result in slight spot position shifts on the detector assembly 112. The single-height ZHS 102 may then be configured to identify a deviation from the determined specimen 108 height from the intended working distance ($WD_0$), and provide a feedback loop to correct for the deviation and maintain the specimen 108 at the working distance ($WD_0$) via servo control. In this regard, the single-height ZHS 102 is intended to maintain the specimen 108 under inspection/review at a defined working distance such that the distance from one or more components of the characterization sub-system (e.g., SEM sub-system 104) is tightly controlled. In optical characterization systems, the single-height ZHS 102 depicted in FIG. 1 may sometimes be referred to as an "autofocus system."

In the context of charged-particle characterization systems (e.g., SEM sub-system 104), fine focus of the charged-particle characterization system (e.g., SEM sub-system 104) may be achieved electronically by either changing the specimen bias voltage or the main lens current. However, there are several limitations to adjusting focus electronically within an SEM sub-system 104, often rendering them incompatible with a traditional single-height ZHS 102.

In particular, adjusting focus electronically either by adjusting specimen bias voltage or main lens current also results in deviations in electron beam landing energy. In this regard, limitations on how much focus shift may be accommodated with electronic adjustments (as opposed to physical specimen 108 height adjustments) are limited due to maximum magnetic focusing lens currents which may not be exceeded. Accordingly, even in charged-particle characterization systems (e.g., SEM sub-system 104) which may be capable of adjusting focus electronically, there is often a need to operate the system 100 at multiple working distances in order to provide for larger focus deviations not achievable with electronic adjustments alone.

Currently, the single-height ZHS 102 depicted in FIG. 1 may be configured to enable multiple working distances only in what may be referred as a "periscope move." Similar to a submarine periscope, the single-height ZHS 102 may actuate the stage assembly 110 at the pre-defined working distance ($WD_0$) to the desired xy-position (e.g., lateral position). Subsequently, the single-height ZHS 102 may actuate the stage assembly 110 in the z-direction (e.g., vertical direction) to the desired adjusted working distance ($WD_{adj}$), and "freeze" the height of the stage assembly 110/specimen 108 at the adjusted working distance ($WD_{adj}$).

While maintaining the specimen 108 at the adjusted working distance ($WD_{adj}$), the detector assembly 112 is not configured/calibrated to receive/detect illumination 107 emanating from the specimen 108. Therefore, at the $WD_{adj}$, the single-height ZHS 102 is unable to provide a feedback loop in order to adjust the working distance of the specimen 108, and thereby "freezes" the specimen 108 at the $WD_{adj}$. Accordingly, the single-height ZHS 102 is unable to provide continual working distance and focus adjustment of the specimen 108 via servo control at working distances other than the pre-defined working distance ($WD_0$). In this regard, characterization processes carried out at adjusted working distances ($WD_{adj}$) may suffer from decreased resolution, particularly when an adjusted working distance ($WD_{adj}$) must be maintained for a prolonged amount of time.

In addition to the lack of continual servo control via a feedback loop at adjusted working distances ($WD_{adj}$), the "periscope move" of the single-height ZHS 102 results in decreased throughput, and is therefore undesirable. For example, the extra z-direction actuation required in a "periscope move" may result in a throughput reduction of approximately 5-10%. Furthermore, in characterization processes which require many working distance adjustments, this throughput decrease may be on the order of a factor of two to three.

Accordingly, embodiments of the present disclosure are directed at curing one or more of the shortfalls of the single-height ZHS 102 identified above. Embodiments of the present disclosure are directed to a multi-height ZHS configured to maintain a specimen at multiple working distance heights. More particularly, embodiments of the present disclosure are directed to the use of optical dispersion in order to direct a plurality of wavelengths to a specimen 108 maintained at a plurality of working distances.

Figure 2A:
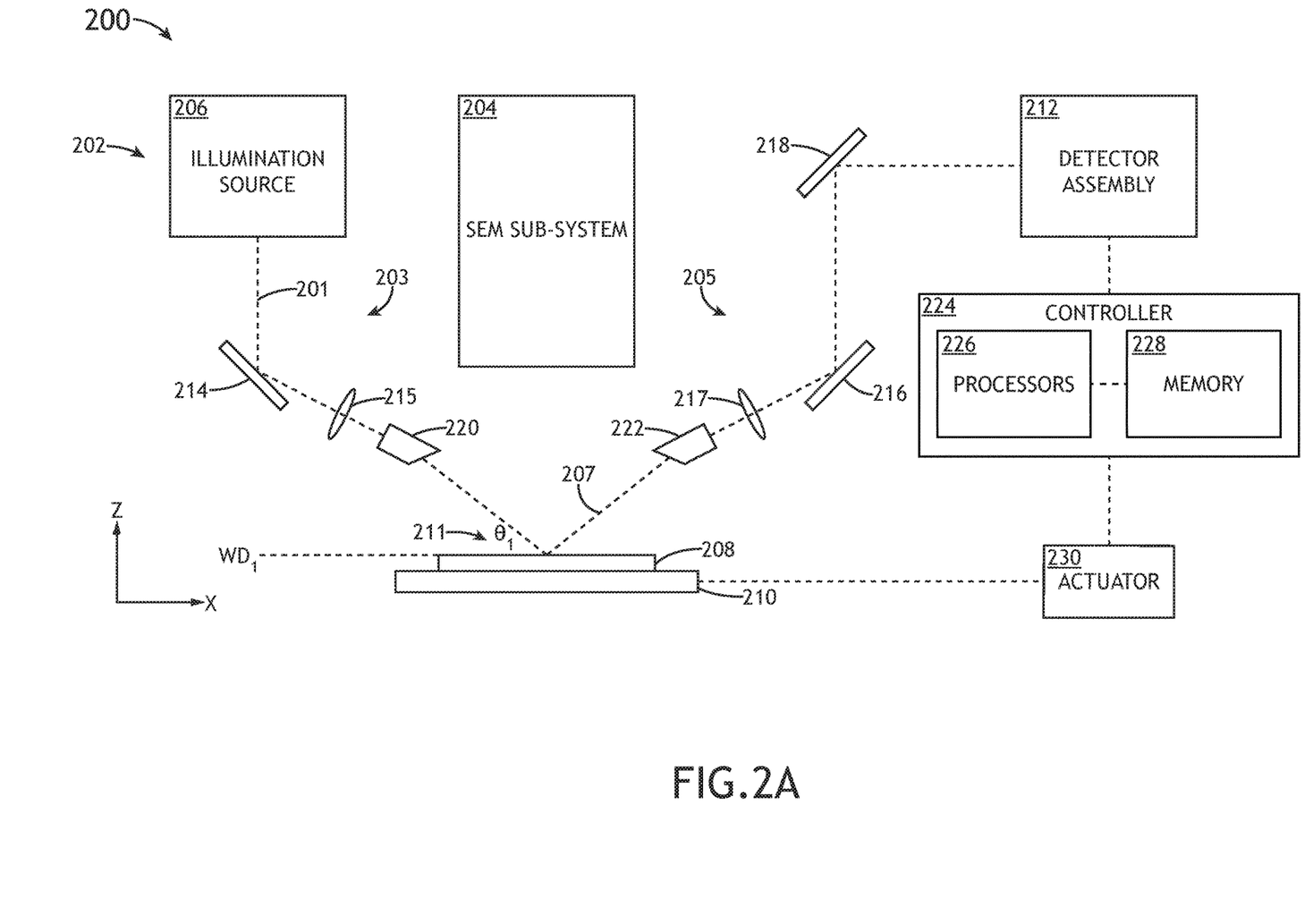
FIG. 2A illustrates a specimen characterization system with a multi-height Z-height sensor (ZHS), in accordance with one or more embodiments of the present disclosure.
Figure 2B:
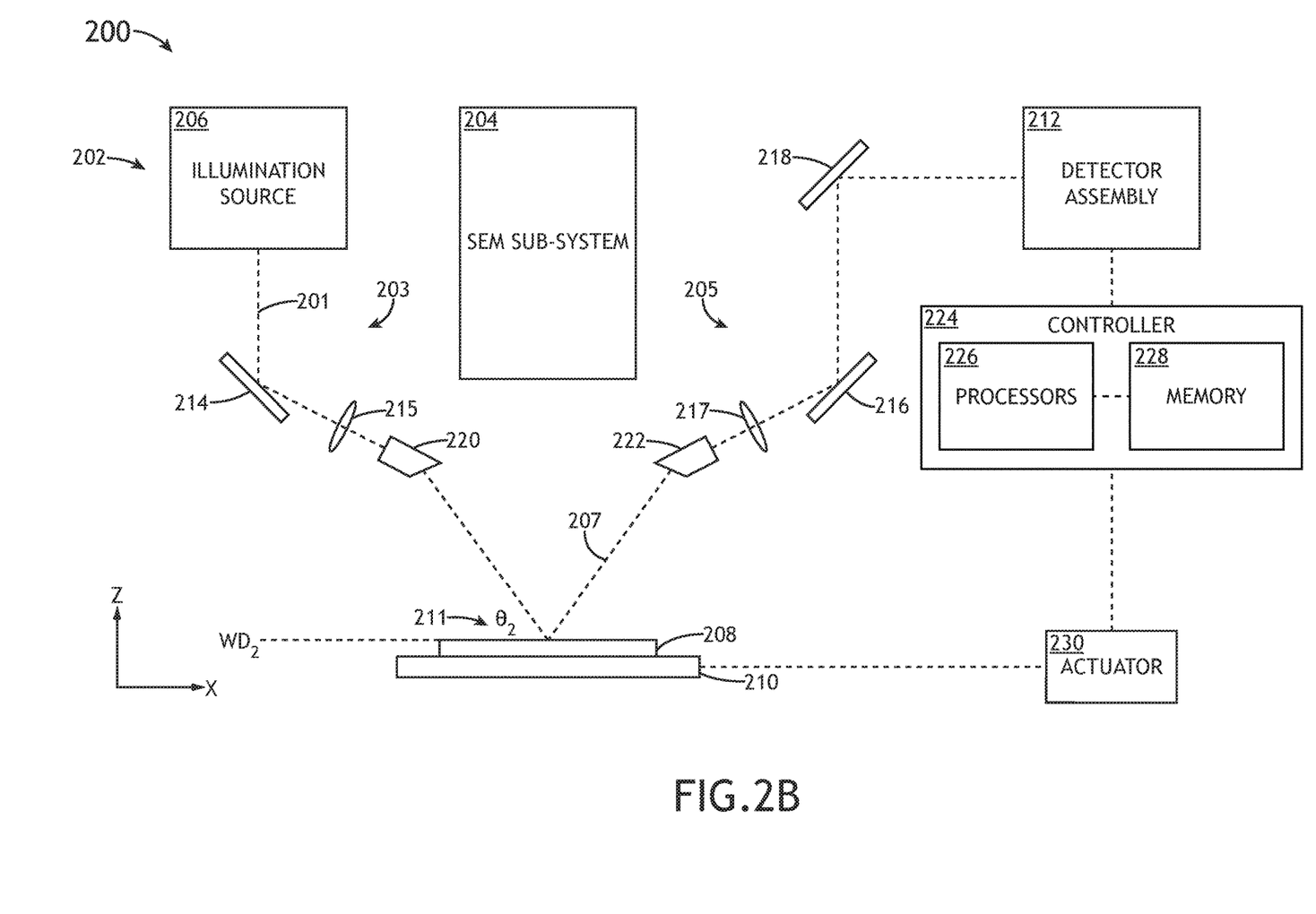
FIG. 2B illustrates a specimen characterization system with a multi-height ZHS, in accordance with one or more embodiments of the present disclosure.

FIG. 2A illustrates a specimen characterization system 200 with a multi-height ZHS 202 in a first characterization mode, in accordance with one or more embodiments of the present disclosure. FIG. 2B illustrates a specimen characterization system 200 with a multi-height ZHS 202 in an additional characterization mode, in accordance with one or more embodiments of the present disclosure.

The system 200 may include, but is not limited to, a multi-height ZHS 202, a characterization sub-system (e.g., SEM sub-system 204), a controller 224, and one or more actuators 230. The controller 224 may include one or more processors 226 and a memory 228, wherein the one or more processors 226 are configured to generate control signals configured to carry out the various steps of the present disclosure.

In one embodiment, the characterization sub-system may include any optical or charged particle system known in the art configured to carry out one or more characterization processes (e.g., inspection processes, review processes, and the like). For example, the system 200 may include a scanning electron microscopy (SEM) sub-system 204 configured to carry out one or more characterization processes/functions on a specimen 208.

The multi-height ZHS 202 may include an illumination source 206, an illumination arm 203, a collection arm 205, and one or more detector assemblies 212. In one embodiment, illumination source 206 is configured to generate an illumination beam 201 and direct the illumination beam 201 to the specimen 208 disposed on a stage assembly 210 via the illumination arm 203. The illumination source 206 may include any illumination source known in the art configured to generate one or more illumination beams 201 including, but not limited to, a broadband illumination source (e.g., discharge lamp), a narrow band illumination source (e.g., a laser source), a light emitting diode (LED) illumination source, and the like. By way of another example, the multi-height ZHS 202 may include a plurality of illumination sources 206. It is contemplated herein that the one or more illumination sources 206 may be configured to generate an illumination beam 201 with illumination including a plurality of wavelengths.

Specimen 208 may include any specimen known in the art including, but not limited to, a wafer, a reticle, a photomask, and the like. In one embodiment, specimen 208 is disposed on a stage assembly 210 to facilitate movement of specimen 208. In another embodiment, the stage assembly 210 is an actuatable stage. For example, the stage assembly 210 may be communicatively coupled to one or more actuators 230 configured to selectably actuate/translate the specimen 208 along one or more linear directions (e.g., x-direction, y-direction, and/or z-direction). By way of another example, the one or more actuators 230 may be configured to selectably rotate the stage assembly 210 and specimen 208 along a rotational direction.

In one embodiment, the multi-height ZHS 202 may be configured to maintain the specimen 208 at a plurality of working distances, wherein a working distance defines a distance between the specimen 208 and a point of reference of the SEM sub-system 204 (e.g., electron beam source, objective lens, and the like). In this regard, stage assembly 210 may be configured to maintain the specimen 208 at a first working distance and at least one additional working distance. It is noted herein that the plurality of working distances may be measured from any point of reference including, but not limited to, a baseline stage assembly 210 height, a component of the SEM sub-system 204 (e.g., electron beam source, objective lens, and the like), and the like.

Comparing FIG. 2A and FIG. 2B, it may be seen that the stage assembly 210 may be configured to maintain the specimen 208 at multiple working distances. For example, the stage assembly 210 may be configured to maintain the specimen 208 at a first working distance ($WD_1$) (shown in FIG. 2A), and a second working distance ($WD_2$) (shown in FIG. 2B), wherein the second working distance ($WD_2$) is different from the first working distance ($WD_1$). It is contemplated herein that multi-height ZHS 202 may be configured to maintain the specimen at any number of working distances (e.g., $WD_1$-$WD_n$). In this regard, the second working distance (WD$_2$) may generally be regarded as referring to at least one additional working distance (WD$_n$).

In one embodiment, the stage assembly may be configured to maintain the specimen 208 at varying working distances depending on the applicable characterization mode. For example, a characterization process may include multiple characterization modes corresponding to multiple steps of the characterization process. During each step (e.g., each characterization mode), the specimen 208 may be required to be maintained at varying heights. In this regard, the stage assembly 210 may be configured to maintain the specimen 208 at varying heights depending on the applicable characterization mode. For instance, the stage assembly 210 maintains a height of the specimen 208 at a first working distance (WD$_1$) during a first characterization mode (shown in FIG. 2A), and may be further configured to maintain the specimen 208 at a second working distance (WD$_2$) during a second characterization mode (shown in FIG. 2B). The features of the various characterization modes, (e.g., associated working distances, corresponding stage assembly 210 heights, associated illumination wavelengths, steps of a characterization process carried out during the characterization mode, and the like) may be stored in memory 228.

The illumination arm 203 may include one or more optical elements configured to direct the illumination beam 201 to the specimen 208. The one or more optical elements of the illumination arm 203 may include any optical elements known in the art. For example, as shown in FIG. 2A, the illumination arm 203 may include one or more mirrors 214 and one or more lenses 215. By way of another example, the illumination arm 203 may include one or more dispersive optical elements configured to induce optical dispersion of the illumination beam 201 depending on the wavelength of illumination within the illumination beam 201. As used herein, the term "dispersive optical element" may be used to refer to an optical element which exhibits a varying optical index of refraction depending on the wavelength of the illumination beam 201. In this regard, the illumination arm 203 may include one or more optical elements configured to direct the illumination beam 201 to the sample at varying incidence angles 211 based upon the illumination within the illumination beam 201. For instance, as shown in FIG. 2A, the illumination arm 203 may include, but is not limited to, one or more prisms 220.

The incidence angle 211 may be defined as the angle of incidence between the illumination beam 201 path and the surface of the specimen 208, as shown in FIG. 2A. It is further contemplated herein that the incidence angle 211 may be dependent on the amount of deflection induced by the illumination arm 203 (e.g., prism 220). For example, in some embodiments, the prism 220 may induce a deflection of approximately 0.5° to achieve a first incidence angle 211. By way of another example, the prism 220 may induce a deflection of approximately 2° to achieve a second incidence angle 211 different from the first incidence angle 211. Further, the incidence angle 211 may vary depending on the wavelength of illumination within the illumination beam 201. It is contemplated herein that various characteristics of the prism 220 may be selected/adjusted in order to obtain desired incidence angles 211. Characteristics of the prism 220 which may be selected/adjusted may include, but are not limited to, the material of the prism 220, the angle of the prism 220 facets, and the like.

While the illumination arm 203 is shown and described as including one or more prisms 220, this is not to be regarded as a limitation of the present disclosure, unless noted otherwise herein. In this regard, the illumination arm 203 may additionally and/or alternatively include any other optical element configured to induce wavelength-dependent optical dispersion including, but not limited to, lenses, diffraction gratings, mirrored gratings, and the like.

In one embodiment, the illumination arm 203 is configured to direct varying wavelengths of the illumination beam 201 to the specimen 208 such that specific wavelengths are directed to the specimen 208 maintained at varying working distances. For example, the prism 220 may be configured to induce varying degrees of deflection within the illumination beam 201 depending on the wavelength of illumination within the illumination beam 201, and may thereby be configured to deflect illumination of varying wavelengths to the specimen 208 maintained at varying working distances. In this regard, the illumination arm 203 (e.g., prism 220) may be configured to induce wavelength-dependent optical dispersion.

For example, the illumination arm 203 may be configured to direct the illumination beam 201 such that illumination of a first wavelength is directed to the specimen 208 maintained at the first working distance (WD$_1$) during a first characterization mode. Similarly, the illumination arm 203 may be configured to direct illumination of a second wavelength different from the first wavelength to the specimen 208 maintained at the second working distance (WD$_2$) during a second characterization mode. It is contemplated herein that deflecting/refracting the illumination beam 201 depending upon the wavelengths of the illumination beam 201 may allow for the multi-height ZHS 202 to maintain optical alignment and provide for active working distance control across a plurality of working distances.

As noted previously herein, the illumination arm 203 may be configured to direct the illumination beam 201 to the specimen 208 at varying incidence angles 211. In particular, the illumination arm 203 may be configured to induce wavelength-dependent optical dispersion such that illumination of varying wavelengths is directed to the specimen 208 at varying working distances at varying incidence angles.

For example, referring to FIG. 2A, the stage assembly 210 may be configured to maintain the specimen 208 at a first working distance (WD$_1$) during a first characterization mode. Throughout the first characterization mode, the illumination source 206 may be configured to generate an illumination beam 201 including illumination of a first wavelength. The illumination arm 203 may then be configured to induce a deflection of the illumination beam 201 such that the illumination beam is directed to the specimen 208 maintained at the first working distance (WD$_1$) via a first incidence angle 211 ($\theta_1$).

Comparatively, referring to FIG. 2B, the stage assembly 210 may be configured to maintain the specimen 208 at a second working distance (WD$_2$) during a second characterization mode. Throughout the second characterization mode, the illumination source 206 may be configured to generate an illumination beam 201 including illumination of a second wavelength different from the first wavelength. The illumination arm 203 may then be configured to induce a deflection of the illumination beam 201, wherein the illumination arm 203 induces a differing deflection of the illumination beam 201 as compared to the previous example due to the varying wavelengths of the illumination beam 201. Accordingly, the illumination beam 201 is directed to the specimen 208 maintained at the second working distance (WD$_2$) via a second incidence angle 211 ($\theta_2$), wherein the second incidence angle 211 is different from the first incidence angle 211 (e.g., $\theta_2 \neq \theta_1$).

In another embodiment, the collection arm 205 of the multi-height ZHS 202 may include one or more optical elements configured to collect illumination 207 emanating (e.g., reflected, refracted, and the like) from the surface of the specimen 208 and direct the collected illumination 207 to the detector assembly 212. The one or more optical elements of the collection arm 205 may include any optical elements known in the art. For example, as shown in FIG. 2A, the collection arm 205 may include a mirror 216, one or more lenses 217, and a mirror 218. By way of another example, the collection arm 205 may include one or more prisms 222.

In another embodiment, the multi-height ZHS 202 includes a detector assembly 212 configured to collect and detect illumination 207 emanated from the surface of the specimen 208. The detector assembly 212 may include any detector assembly known in the art. For example, the detector assembly 212 may include, but is not limited to, a charge coupled device (CCD) detector, a complementary metal-oxide semiconductor (CMOS) detector, a time-delay integration (TDI) detector, a bicell photodiode detector, a positioning sensing device (PSD), and the like.

In another embodiment, the detector assembly 212 is communicatively coupled to the controller 224. In one embodiment, the controller 224 and/or detector assembly 112 may then be configured to determine a height of the specimen 208 based on the relative positioning of the illumination 207 on the detector assembly 212. In this regard, changes in the working distance of the specimen 208 would result in changes of the spot position of the illumination 207 on the detector assembly 212. For example, slight changes in the working distance of the specimen 208 would result in slight spot position shifts on the detector assembly 212.

In one embodiment, the controller 224 includes one or more processors 226 and a memory 228, wherein the one or more processors 226 are configured to execute a set of program instructions stored in memory 228, wherein the set of program instructions are configured to cause the one or more processors 226 to carry out various steps of the present disclosure. For example, the one or more processors 226 of the controller 224 may be configured to execute a set of program instructions stored in memory 228, wherein the program instructions are configured to cause the one or more processors 226 to: generate one or more control signals configured to cause the illumination source 206 of the multi-height ZHS 202 to direct an illumination beam 201 to a specimen 208; determine a specimen 208 height value based on illumination 207 received by the detector assembly 212; determine a deviation value from a specified working distance height (e.g., $WD_1$, $WD_2$, $WD_n$); generate one or more control signals configured to cause the one or more actuators 230 to adjust a height of the stage assembly 210 to correct for the identified deviation value; generate one or more control signals configured to cause the one or more actuators 230 to adjust a height of the stage assembly 210 to a pre-defined stage assembly 210 height corresponding to a pre-defined working distance (e.g., $WD_1$, $WD_2$, $WD_n$); and generate one or more control signals configured to cause a characterization system (e.g., SEM sub-system 204) to carry out one or more characterization processes on the specimen 208. Each of these steps/functions will be addressed in turn.

In one embodiment, the controller 224 is configured to generate one or more control signals configured to cause the one or more actuators 230 to selectably actuate/translate the specimen 208 to a first working distance. For example, during a first characterization mode illustrated in FIG. 2A, the specimen 208 may be intended to be maintained at the first working distance ($WD_1$), which is stored in memory 228. In this example, the actuators 230 may be configured to actuate the stage assembly 210 to a first stage assembly height which maintains a surface of the specimen 208 at the first working distance ($WD_1$). The first stage assembly height corresponding to the first working distance ($WD_1$) may also be stored in memory 228.

In another embodiment, the controller 224 is configured to generate one or more control signals configured to cause the illumination source 206 of the multi-height ZHS 202 to direct an illumination beam 201 to a specimen 208. In one embodiment, the controller 224 may be configured to cause the illumination source 206 to generate an illumination beam 201 including illumination of a specified wavelength which corresponds to the working distance of the specimen 208. For example, the illumination arm 203 may be configured to deflect illumination of a first wavelength to the first working distance ($WD_1$) during a first characterization mode. The first wavelength may be stored in memory 228 such that the controller 224 is configured to cause the illumination source 206 to generate illumination of the first wavelength while the specimen 208 is maintained at the first working distance ($WD_1$) during the first characterization mode.

Subsequently, the illumination arm 203 may be configured to direct the illumination beam 201 including illumination of the first wavelength to the specimen 208 maintained at the first working distance ($WD_1$). Additionally, the collection arm 205 may be configured to collect illumination 207 emanated from the surface of the specimen 208 and direct illumination 207 to the detector assembly 212.

In another embodiment, the controller 224 is configured to determine a specimen 208 height value based on illumination received/detected by the detector assembly 212. For example, as noted previously herein, the controller 224 may be configured to determine a specimen 208 height value (e.g., height of the specimen 208) based on the position of a spot of the illumination 207 on the detector assembly 212. Data/information associated with determining a specimen 208 height value as a function of the illumination 207 spot position on the detector assembly 212 may be stored in memory 228.

In another embodiment, the controller 224 is configured to determine a deviation value from a specified working distance height (e.g., $WD_1$, $WD_2$, $WD_n$). For example, during the first characterization mode, the specimen 208 is intended to be maintained at the first working distance ($WD_1$). In this regard, the controller 224 may determine a deviation value from the first working distance ($WD_1$) by determining the absolute value of the difference between the determined specimen 208 height value and the first working distance ($WD_1$) (e.g., Deviation Value=|(Specimen Height Value)–$WD_1$|). By way of another example, during a second characterization mode where the specimen 208 is intended to be maintained at the second working distance ($WD_2$), the deviation value may be defined as Deviation Value=|(Specimen Height Value)–$WD_2$|).

In another embodiment, the controller 224 is configured to generate one or more control signals configured to cause the one or more actuators 230 to adjust a height of the stage assembly 210 to correct for the identified deviation value. For example, upon identifying a working distance deviation value of the specimen 208, the controller 224 may be configured to cause the actuators 230 to adjust a height of the stage assembly 210 to the first stage assembly height corresponding to the first working distance ($WD_1$) (e.g., the first stage assembly 210 height which maintains the specimen 208 at the first working distance ($WD_1$)). As noted previously herein, this feedback loop configured to correct for deviations from the intended working distance may allow the multi-height ZHS 202 to efficiently maintain accurate working distances throughout the entirety of a characterization process.

In another embodiment, the controller 224 may be configured to generate one or more control signals configured to cause the one or more actuators 230 to adjust a height of the stage assembly 210 to an additional pre-defined stage assembly 210 height corresponding to an additional pre-defined working distance (e.g., $WD_2$, $WD_n$) different from the first working distance ($WD_1$). For example, after maintaining the specimen 208 at the first working distance ($WD_1$) throughout the first characterization mode, the controller 224 may be configured to adjust the height of the specimen 208 to a second working distance ($WD_2$) for the duration of a second characterization mode.

In one embodiment, the controller 224 may be further configured to generate one or more control signals configured to cause a characterization system (e.g., SEM sub-system 204) to carry out one or more characterization processes on the specimen 208. For example, referring to the examples above, the controller 224 may be communicatively coupled to the SEM sub-system 204 and configured to cause the SEM sub-system 204 to carry out one or more characterization processes during the first characterization mode and/or second characterization mode.

It is contemplated herein that the multi-height ZHS 202 of the present disclosure may allow for continual working distance monitoring and control at a plurality of working distances. This may enable more accurate and efficient characterization processes by facilitating focus on the specimen, thereby leading to improved image quality. Furthermore, by eliminating the need to "freeze" the stage assembly 210 during a periscope move, as is required with the single-height ZHS 102, the multi-height ZHS 202 of the present disclosure may prevent the need to freeze the stage assembly 210/specimen 208, thereby improving both image quality and throughput.

While embodiments of the present disclosure are shown and described in the context of wavelength-dependent optical dispersion to direct the illumination beam 201 to the specimen 208 at varying working distances, it is contemplated herein that additional and/or alternative methods may be used. For example, in an alternative embodiment to the one or more prisms 220 configured to enable optical dispersion, the system 200 may alternatively use actuatable mirrors and encoders in order to achieve the necessary illumination beam 201 deflections/diffractions. For instance, system 200 may alternatively use an actuatable mirror instead of the prism 220 in order to achieve the varying degrees of beam deflection required to direct the illumination beam 201 to the specimen 208 at varying working distances. Accordingly, in additional and/or alternative embodiments, the beam deflection/diffraction shown and described herein may be achieved by means other than wavelength-dependent optical dispersion. However, it is further noted herein that the multi-height ZHS 202 based on wavelength-dependent optical dispersion may provide a number of advantages over alternative approaches, as the multi-height ZHS 202 shown and described does not require moving components and may not be required to be housed in a high-voltage vacuum environment.

It is noted herein that the one or more components of system 100 may be communicatively coupled to the various other components of system 100 in any manner known in the art. For example, the one or more processors 226 may be communicatively coupled to each other and other components via a wireline or wireless connection (e.g., copper wire, fiber optic cable, RF coupling, IR coupling, WiFi, WiMax, Bluetooth, 3G, 4G, 4G LTE, 5G, and the like).

In one embodiment, the one or more processors 226 may include any one or more processing elements known in the art. In this sense, the one or more processors 226 may include any microprocessor-type device configured to execute software algorithms and/or instructions. In one embodiment, the one or more processors 226 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 226. In general, the term "processor" may be broadly defined to encompass any device having one or more processing elements, which execute program instructions from memory 228. Moreover, different subsystems of the system 100 (e.g., multi-height ZHS 202, SEM sub-system 204, actuators 230, and the like) may include processor or logic elements suitable for carrying out at least a portion of the steps described throughout the present disclosure. Therefore, the above description should not be interpreted as a limitation on the present disclosure but merely an illustration.

The memory 228 may include any storage medium known in the art suitable for storing program instructions executable by the associated one or more processors 226 and the data associated with the various characterization modes. For example, the memory 228 may include a non-transitory memory medium. For instance, the memory 228 may include, but is not limited to, a read-only memory (ROM), a random-access memory (RAM), a magnetic or optical memory device (e.g., disk), a magnetic tape, a solid-state drive and the like. It is further noted that memory 228 may be housed in a common controller housing with the one or more processors 226. In an alternative embodiment, the memory 228 may be located remotely with respect to the physical location of the processors 226, controller 224, and the like. In another embodiment, the memory 228 maintains program instructions for causing the one or more processors 226 to carry out the various steps described through the present disclosure.

In one embodiment, a user interface may be communicatively coupled to the controller 224. In one embodiment, the user interface may include, but is not limited to, one or more desktops, tablets, smartphones, smart watches, or the like. In another embodiment, the user interface includes a display used to display data of the system 100 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via the user interface. In this regard, the user interface may be configured to receive one or more input commands from a user, wherein the one or more input commands are configured to modify/adjust one or more characteristics of the multi-height ZHS 202, SEM sub-system 204, controller 224, actuators 230, and the like. For instance, a user may input one or more control commands, via the user interface, to adjust a characterization mode, a characterization process of the SEM sub-system 204, a working distance of the specimen 208, and the like.

Figure 3A:
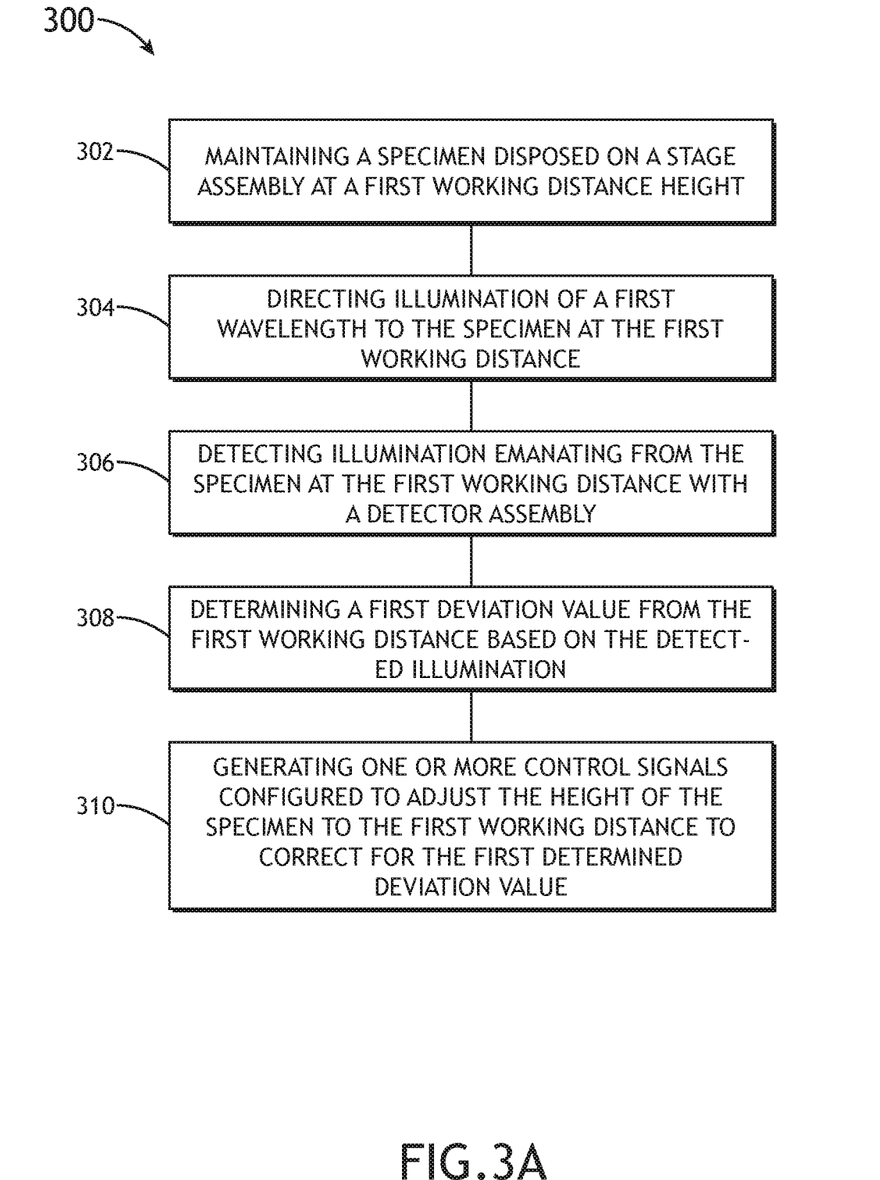
FIG. 3A illustrates a portion of a method for maintaining a specimen at multiple working distance heights, in accordance with one or more embodiments of the present disclosure.
Figure 3B:
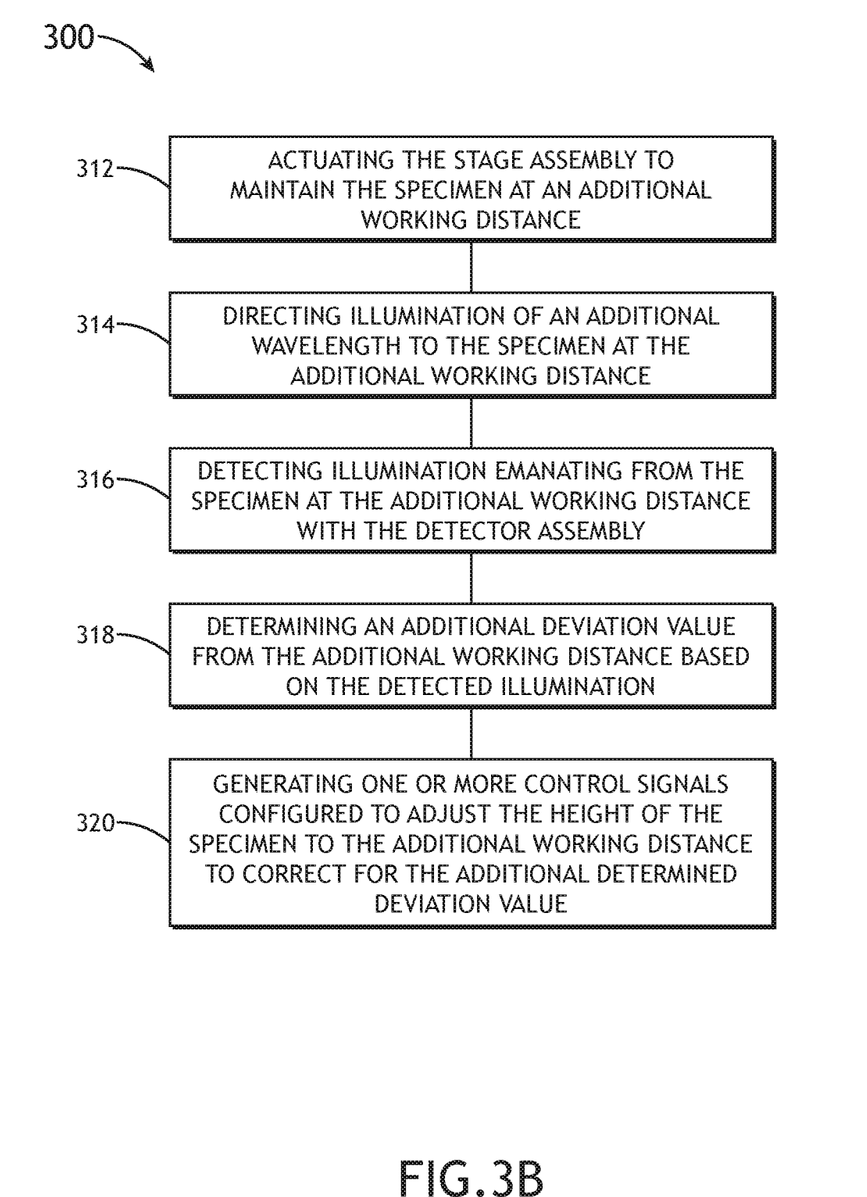
FIG. 3B illustrates a portion of a method for maintaining a specimen at multiple working distance heights, in accordance with one or more embodiments of the present disclosure.

FIGS. 3A-3B illustrate a method for maintaining a specimen at multiple working distance heights, in accordance with one or more embodiments of the present disclosure. It is noted herein that the steps of method 300 may be implemented all or in part by system 200. It is further recognized, however, that the method 300 is not limited to the system 200 in that additional or alternative system-level embodiments may carry out all or part of the steps of method 300.

In a step 302, a specimen disposed on a stage assembly is maintained at a first working distance height. For example, as shown in FIG. 2A, a specimen 208 disposed on a stage assembly 210 may be maintained at a first working distance (WD$_1$) during a first characterization mode.

In a step 304, illumination of a first wavelength is directed to the specimen at the first working distance (WD$_1$). For example, the controller 224 may cause the illumination source 206 to generate an illumination beam 201 including illumination of a first wavelength during the first characterization mode (e.g., while the specimen 208 is maintained at the first working distance (WD$_1$)). The illumination arm 203 of the multi-height ZHS 202 may then be configured to direct the illumination of the first wavelength to the specimen 208 maintained at the first working distance (WD$_1$).

In a step 306, illumination emanating from the specimen maintained at the first working distance (WD$_1$) is detected with a detector assembly. For example, as shown in FIG. 2A, a collection arm 205 may be configured to collect illumination 207 emanating from the specimen 208 and direct the illumination 207 to a detector assembly 212.

In a step 308, a first deviation value from the first working distance is determined based on the detected illumination. For example, the controller 224 may be configured to determine a deviation value from the first working distance (WD$_1$) based on the illumination 207 detected by the detector assembly 212.

In a step 310, one or more control signals are generated, wherein the one or more control signals are configured to adjust the height of the specimen to the first working distance (WD$_1$). The height of the specimen 208 may be adjusted to correct for the determined first deviation value. For example, the controller 224 may be configured to provide a feedback loop including one or more control signals configured to adjust the stage assembly 210 to a first stage assembly height configured to maintain the specimen 208 at the first working distance (WD$_1$).

In another embodiment, the controller 224 may be configured to cause a characterization system (e.g., SEM sub-system 204) to carry out one or more characterization processes and/or characterization steps while the specimen 208 is maintained at the first working distance (WD$_1$) during the first characterization mode. The one or more characterization processes/steps may include any specimen characterization processes/steps known in the art including, but not limited to, inspection, review, and the like.

In a step 312, the stage assembly is actuated to maintain the specimen at an additional working distance. For example, as shown in FIG. 2B, at the start of a second characterization mode, the controller 224 may be configured to generate one or more control signals configured to cause the one or more actuators 230 to actuate the stage assembly 210 in order to actuate the specimen 208 from the first working distance (WD$_1$) to a second working distance (WD$_2$) different from the first working distance.

In a step 314, illumination of an addition wavelength is directed to the specimen at the additional working distance. For example, the controller 224 may cause the illumination source 206 to generate an illumination beam 201 including illumination of a second wavelength (different from the first wavelength) during a second characterization mode (e.g., while the specimen 208 is maintained at the second working distance (WD$_1$)). The illumination arm 203 of the multi-height ZHS 202 may then be configured to direct the illumination of the second wavelength to the specimen 208 maintained at the second working distance (WD$_2$).

In a step 316, illumination emanating from the specimen maintained at the additional working distance is detected with the detector assembly. For example, as shown in FIG. 2B, a collection arm 205 may be configured to collect illumination 207 emanating from the specimen 208 and direct the illumination 207 to a detector assembly 212.

In a step 318, an additional deviation value from the additional working distance is determined based on the detected illumination. For example, the controller 224 may be configured to determine a deviation value from the second working distance (WD$_2$) based on the illumination 207 detected by the detector assembly 212.

In a step 320, one or more control signals are generated, wherein the one or more control signals are configured to adjust the height of the specimen to the additional working distance. The height of the specimen 208 may be adjusted to correct for the determined additional deviation value. For example, the controller 224 may be configured to provide a feedback loop including one or more control signals configured to adjust the stage assembly 210 to a second stage assembly height configured to maintain the specimen 208 at the second working distance (WD$_2$).

In another embodiment, the controller 224 may be configured to cause a characterization system (e.g., SEM sub-system 204) to carry out one or more characterization processes and/or characterization steps while the specimen 208 is maintained at the second working distance (WD$_2$) during the first characterization mode. The one or more characterization processes/steps may include any specimen characterization processes/steps known in the art including, but not limited to, inspection, review, and the like.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
a stage assembly configured to receive a specimen, the stage assembly configured to maintain a height of the specimen at a first working distance height during a first characterization mode and an additional working distance height during an additional characterization mode;
a z-height sensor system comprising:
one or more illumination sources configured to generate an illumination beam;
an illumination arm including a first set of one or more optical elements including one or more dispersive optical elements configured to direct a portion of the illumination beam including illumination of a first wavelength to the specimen during the first characterization mode at a first angle of incidence when the specimen is at the first working distance height, and direct a portion of the illumination beam including illumination of an additional wavelength to the specimen during the additional characterization mode at an additional angle of incidence when the specimen is at the additional working distance height such that illumination from the illumination beam is directed to the specimen at varying incidence angles based on the wavelength within the illumination beam and a working distance height, wherein the specimen is continuously adjusted by the stage assembly from the first working distance height to the additional working distance height prior to the portion of the illumination beam including illumination of the additional wavelength being directed to the specimen during the additional characterization mode at the additional angle of incidence to maintain a focus of the illumination beam on the specimen; and
a detector assembly configured to receive illumination emanated from the specimen; and
a controller communicatively coupled to the detector assembly, the controller configured to determine a specimen height value based on the illumination received by the detector assembly.

2. The system of claim 1, further comprising one or more actuators configured to adjust a height of the stage assembly.

3. The system of claim 2, wherein the controller is further configured to:
determine a deviation value from at least one of the first working distance height or the additional working distance height based on the illumination received by the detector assembly; and
generate one or more control signals configured to cause the one or more actuators to adjust a height of the stage assembly to correct for the determined deviation value.

4. The system of claim 2, wherein the controller is further configured to generate one or more control signals configured to cause the one or more actuators to adjust a height of the stage assembly to at least one of a first stage assembly height corresponding to the first working distance height and an additional stage assembly height corresponding to the additional working distance height.

5. The system of claim 1, wherein the one or more illumination sources includes a plurality of illumination sources, wherein directing a portion of the illumination beam including illumination of a first wavelength to the specimen during the first characterization mode comprises:
directing the illumination of the first wavelength to the specimen via a first incidence angle during the first characterization mode via a first illumination source of the plurality of illumination sources.

6. The system of claim 5, wherein directing a portion of the illumination beam including illumination of an additional wavelength during the additional characterization mode comprises:
directing the illumination of the additional wavelength to the specimen via an additional incidence angle different from the first incidence angle during the additional characterization mode via an additional illumination source of the plurality of illumination sources.

7. The system of claim 1, wherein the first set of one or more optical elements comprises a prism.

8. The system of claim 1, further comprising a collection arm including a second set of one or more optical elements configured to collect illumination emanating from the specimen and direct the collected illumination to the detector assembly.

9. The system of claim 1, wherein the one or more illumination sources comprises at least one of a broadband illumination source, a laser illumination source, and a light emitting diode (LED) illumination source.

10. The system of claim 1, wherein the controller is communicatively coupled to a scanning electron microscopy sub-system, wherein the controller is further configured to generate one or more control signals configured to cause the scanning electron microscopy sub-system to carry out one or more characterization processes on the specimen.

11. A specimen characterization system, comprising:
a scanning electron microscopy sub-system configured to carry out one or more characterization processes on a specimen;
a stage assembly configured to receive the specimen, the stage assembly configured to maintain a height of the specimen at a first working distance height during a first characterization mode and an additional working distance height during an additional characterization mode;
a z-height sensor system comprising:
one or more illumination sources configured to generate an illumination beam;
an illumination arm including a first set of one or more optical elements including one or more dispersive optical elements configured to direct a portion of the illumination beam to the specimen during the first characterization mode at a first angle of incidence when the specimen is at the first working distance height, and direct a portion of the illumination beam to the specimen during the additional characterization mode at an additional angle of incidence when the specimen is at the additional working distance height such that illumination from the illumination beam is directed to the specimen at varying incidence angles based on a wavelength within the illumination beam and a working distance height, wherein the specimen is continuously adjusted by the stage assembly from the first working distance height to the additional working distance height prior to the portion of the illumination beam including illumination of an additional wavelength being directed to the specimen during the additional characterization mode at the additional angle of incidence to maintain a focus of the illumination beam on the specimen; and a detector assembly configured to receive illumination emanated from the specimen; and a controller communicatively coupled to the detector assembly, the controller configured to determine a specimen height value based on the illumination received by the detector assembly.

12. The system of claim 11, wherein the controller is further configured to:

determine a deviation value from at least one of the first working distance height or the additional working distance height based on the illumination received by the detector assembly; and generate one or more control signals configured to cause one or more actuators to adjust a height of the stage assembly to correct for the identified deviation value.

13. The system of claim 11, wherein the controller is further configured to generate one or more control signals configured to cause one or more actuators to adjust a height of the stage assembly to at least one of a first stage assembly height corresponding to the first working distance height and an additional stage assembly height corresponding to the additional working distance height.

14. The system of claim 11, wherein the one or more illumination sources includes a plurality of illumination sources, wherein directing a portion of the illumination beam to the specimen during the first characterization mode comprises:

directing illumination of a first wavelength to the specimen via a first incidence angle during the first characterization mode via a first illumination source of the plurality of illumination sources.

15. The system of claim 14, wherein directing a portion of the illumination beam to the specimen during the additional characterization mode comprises:

directing illumination of an additional wavelength to the specimen via an additional angle different from the first angle during the additional characterization mode via an additional illumination source of the plurality of illumination sources.

16. The system of claim 11, wherein the first set of one or more optical elements comprise at least one of an actuatable mirror and a prism.

17. The system of claim 11, further comprising a collection arm including a second set of one or more optical elements configured to collect illumination emanating from the specimen and direct the collected illumination to the detector assembly.

18. The system of claim 11, wherein the one or more illumination sources comprise at least one of a broadband illumination source, a laser illumination source, and a light emitting diode (LED) illumination source.

19. The system of claim 11, wherein the controller is communicatively coupled to the scanning electron microscopy sub-system, wherein the controller is further configured to generate one or more control signals configured to cause the scanning electron microscopy sub-system to carry out one or more characterization processes on the specimen.

20. A method, comprising:

maintaining a specimen disposed on a stage assembly at a first working distance;

directing, via one or more dispersive optical elements, illumination of a first wavelength to the specimen at the first working distance at a first angle of incidence when the specimen is at the first working distance;

detecting illumination emanating from the specimen at the first working distance with a detector assembly;

determining a first deviation value from the first working distance based on the detected illumination;

generating one or more control signals configured to adjust the height of the specimen to the first working distance to correct for the first determined deviation value;

actuating the stage assembly to maintain the specimen at an additional working distance;

directing, via the one or more dispersive optical elements, illumination of an additional wavelength to the specimen at the additional working distance at an additional angle of incidence when the specimen is at the additional working distance such that illumination from an illumination beam is directed to the specimen at varying incidence angles based on the wavelength within the illumination beam, wherein the specimen is continuously adjusted by the stage assembly from the first working distance to the additional working distance prior to the portion of the illumination beam including illumination of the additional wavelength being directed to the specimen during an additional characterization mode at the additional angle of incidence to maintain a focus of the illumination beam on the specimen;

detecting illumination emanating from the specimen at the additional working with the detector assembly;

determining an additional deviation value from the additional working distance based on the detected illumination; and generating one or more control signals configured to adjust the height of the specimen to the additional working distance to correct for the additional determined deviation value.

* * * * *